United States Patent
Hirata et al.

[11] Patent Number: 6,132,243
[45] Date of Patent: Oct. 17, 2000

[54] CARD CONNECTOR ASSEMBLY

[75] Inventors: Hideyuki Hirata, Yokohama; Soichi Watanabe, Yokahoma, both of Japan

[73] Assignee: Molex Incorporated, Lisle, Ill.

[21] Appl. No.: 09/169,555

[22] Filed: Oct. 9, 1998

[30] Foreign Application Priority Data

Oct. 9, 1997 [JP] Japan .................................. 9-293316
Apr. 3, 1998 [JP] Japan .................................. 10-108637

[51] Int. Cl.$^7$ ............................ H01R 13/66; H01R 13/60
[52] U.S. Cl. ........................................... 439/541.5; 439/79
[58] Field of Search .................................. 439/541.5, 108, 439/101, 607, 540.1, 92, 64, 79, 159

[56] References Cited

U.S. PATENT DOCUMENTS

| | | | |
|---|---|---|---|
| 5,176,523 | 1/1993 | Lai | 439/64 |
| 5,286,207 | 2/1994 | McHugh | 439/64 |
| 5,316,488 | 5/1994 | Gardner et al. | 439/79 |
| 5,318,452 | 6/1994 | Brennian, Jr. et al. | 439/79 |
| 5,470,259 | 11/1995 | Kaufman et al. | 439/607 |
| 5,492,481 | 2/1996 | Lewis | 439/159 |
| 5,636,999 | 6/1997 | Hirai et al. | 439/79 |
| 5,688,130 | 11/1997 | Huang | 439/79 |
| 5,725,385 | 3/1998 | Takano et al. | 439/64 |
| 5,775,923 | 7/1998 | Tomioka | 439/79 |

*Primary Examiner*—Renee Luebke
*Assistant Examiner*—Antoine Ngandjui
*Attorney, Agent, or Firm*—Stacey E. Caldwell

[57] ABSTRACT

Disclosed is a card connector comprising a double-deck shell assembly having upper and lower shell compartments for accommodating memory devices in the form of cards, and a pin connector assembly having connection pins adapted to be received in receptacles of each memory device inserted in the associated shell compartment. The pin connector assembly is adapted to be soldered directly to a printed circuit board, and the shell assembly is adapted to be assembled to the connector assembly thus fixed on the printed circuit board. Also disclosed is an assembly method for such a card connector.

11 Claims, 14 Drawing Sheets

CARD CONNECTOR ASSEMBLY

FIELD OF THE INVENTION

The present invention relates to an improved card connector for making required electrical connections to memory devices in the form of cards, such as communication cards, memory cards or hard disk drive (HDD) packages, and an assembly method therefor.

BACKGROUND OF THE INVENTION

Card connectors have been widely used in personal computers, lap-top computers, notebook type computers and the like. A card connector typically comprises a shell assembly for accommodating memory devices in the form of a card, and a pin connector assembly. The shell assembly is often a double-deck structure to accommodate two cards, comprising upper and lower shell compartments to enclose at least a portion of each of the cards, and each shell compartment may be equipped with an ejection mechanism. The connection pins of the pin connector assembly are adapted to be received in receptacles of the memory devices inserted in the shell compartments (see, e.g., Patent Application Laid-Open Nos. 6-332573 and 7-302645).

There are a variety of ways in which a card connector has been mounted in a computer. One such way is where a relay connector is fixed on a printed circuit board of the computer and a card connector is also fixed on the circuit board and the card connector is connected to the relay connector by a flat flexible cable. Another way is where a relay substrate is integrally connected to a pin connector assembly of a card connector and a relay connector is fixed on a printed circuit board of a computer. The card connector is connected to the relay connector through the relay substrate. Still another way is where a pin connector assembly is configured on a rear end thereof to mate with a relay connector which is mounted on a printed circuit board of the computer, and then the card connector is connected to the relay connector by mating the pin connector assembly to the relay connector. Also, a relay plate may be integrally connected to a pin connector assembly of a card connector, and one part of a relay connector may be fixed to the relay plate. The mating part of the relay connector is then fixed to a printed circuit board of the computer, and the card connector is then mounted in the computer by mating the two parts of the relay connector.

Use of a relay connector improves the efficiency and workability of equipping a computer with a card connector, but extra parts such as relay connectors, flat flexible cables, relay plates and the like contribute to higher assembly and component costs of the card connector.

SUMMARY OF THE INVENTION

One object of the present invention is to provide such a card connector that requires no extra components or steps in mounting it on the printed circuit board of a computer.

Another object of the invention is to provide an improved assembly method for such a card connector.

To obtain these objects, a card connector is improved according to the present invention in that it comprises: a shell assembly for accommodating a memory device in the form of at least one card comprising two shell compartments that enclose at least a portion of each of said memory device; and a pin connector assembly having connection pins adapted to be received in a receptacle of the memory device, said pin connector assembly being adapted to be soldered directly to a printed circuit board, and said shell assembly being adapted to be assembled to said pin connector assembly.

In the embodiment shown, the shell assembly is a double-deck structure, receiving one memory device in each of the upper and lower compartments, and the pin connector assembly includes connection pins arranged in upper and lower rows to correspond to the upper and lower compartments of the shell assembly and to be received in corresponding receptacles of the memory devices.

The pin connector assembly comprises an insulating housing and first and second groups of terminals. Each terminal of the first group includes a connection pin at one end and a solder tail at the other end, wherein the solder tail extends below the connection pin, generally parallel to and away from the connection pin, that is, the solder tail extends toward the rear of the pin connector assembly. Each terminal of the second group also includes a connection pin at one end and a solder tail at the other end, however the solder tail extends below the connection pin, generally parallel to and toward the connection pin, that is, toward the front of the pin connector assembly. The first and second groups of terminals are arranged at upper and lower levels, respectively, corresponding to the upper and lower compartments of the shell assembly, with their connection pins extending toward the front of said insulating housing and adapted to be received in the receptacles of the memory devices.

The pin connector assembly may include a first alignment device applied to the insulating housing to maintain the position of the solder tails of the second group of terminals, and a second alignment device may be applied to the insulating housing to maintain the position of the solder tails of the first group of terminals.

The insulating housing includes two side arms extending forward on opposite sides thereof. The side arms are used as guide means to assemble the shell assembly to the pin connector assembly. Each side arm includes upper and lower longitudinal guide slots to guide upper and lower engagement nails integrally connected to the upper and lower shell compartments. The upper and lower longitudinal guide slots include engagement projections formed therein to prevent the engagement nails from being pulled out of the longitudinal guide slots.

The insulating housing further includes upper and lower receiving slots in each side arm extending rearwardly from the front of the insulating housing. Each of the upper and lower shell compartments includes an engagement piece integrally formed at each end of the compartment, thereby permitting the assembly of the shell assembly to the pin connector assembly by inserting the engagement pieces of the upper and lower shells into the upper and lower receiving slots of the insulating housing.

A method of assembling a card connector as described above is also disclosed, wherein the card connector comprises a shell assembly having two shell compartments for at least one memory device, and a pin connector assembly whose connection pins are adapted to be received in the receptacle of each memory device inserted in the associated shell compartment, the method comprising the steps of: fixing the pin connector assembly on a printed circuit board by soldering; and subsequently fixing the shell assembly to the pin connector assembly.

A further step may include fixing the shell assembly to the printed circuit board with the aid of fixing legs integrally connected to the shells.

As may be understood from the above, the pin connector assembly is configured so as to permit it to be fixed directly to a printed circuit board by soldering, requiring no extra mounting components or assembly steps.

Other objects and advantages of the present invention will be understood from the following description of a card connector according to the present invention, which is shown in the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
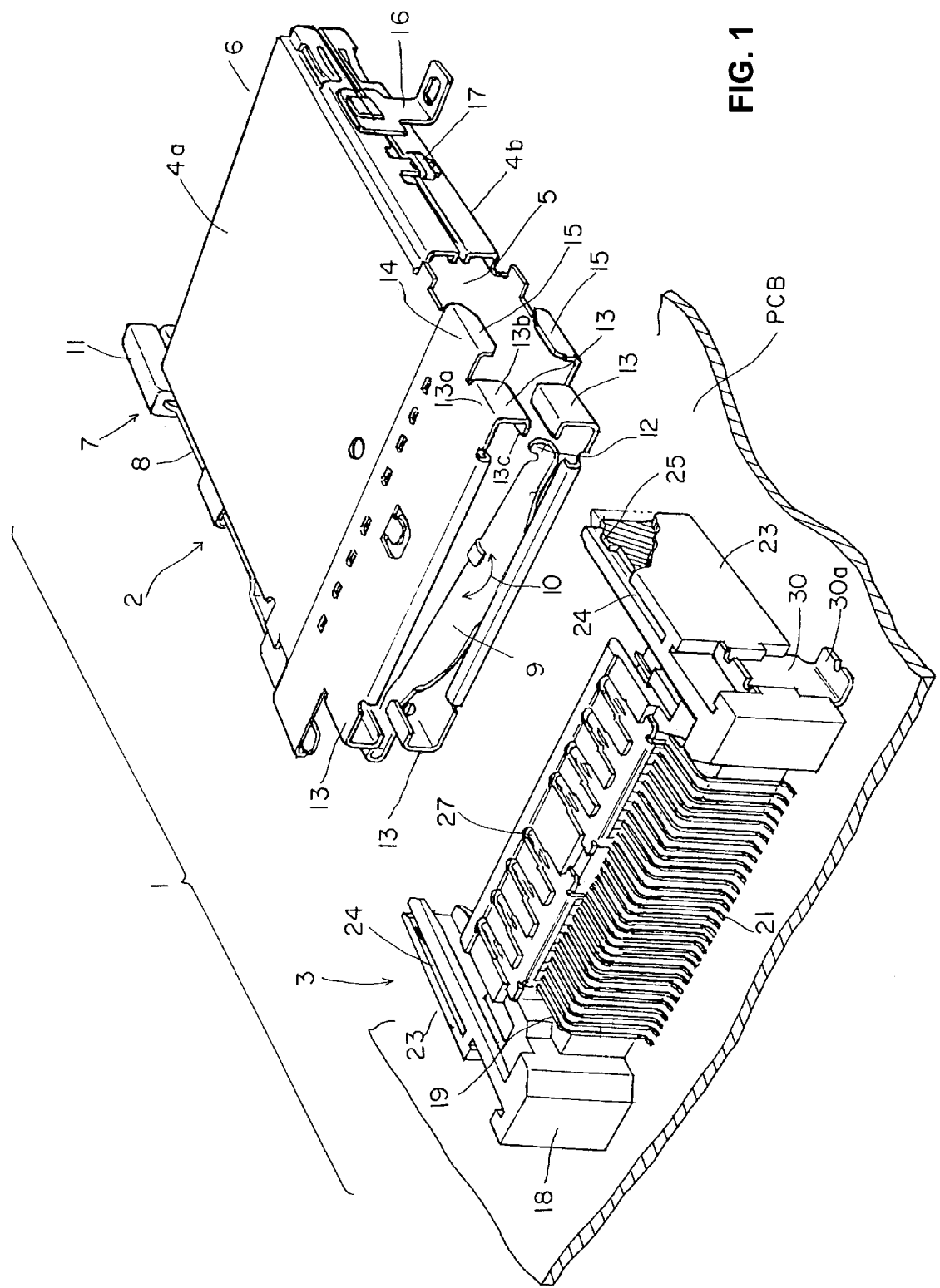
FIG. 1 is a perspective view of a card connector according to the present invention.
Figure 2:
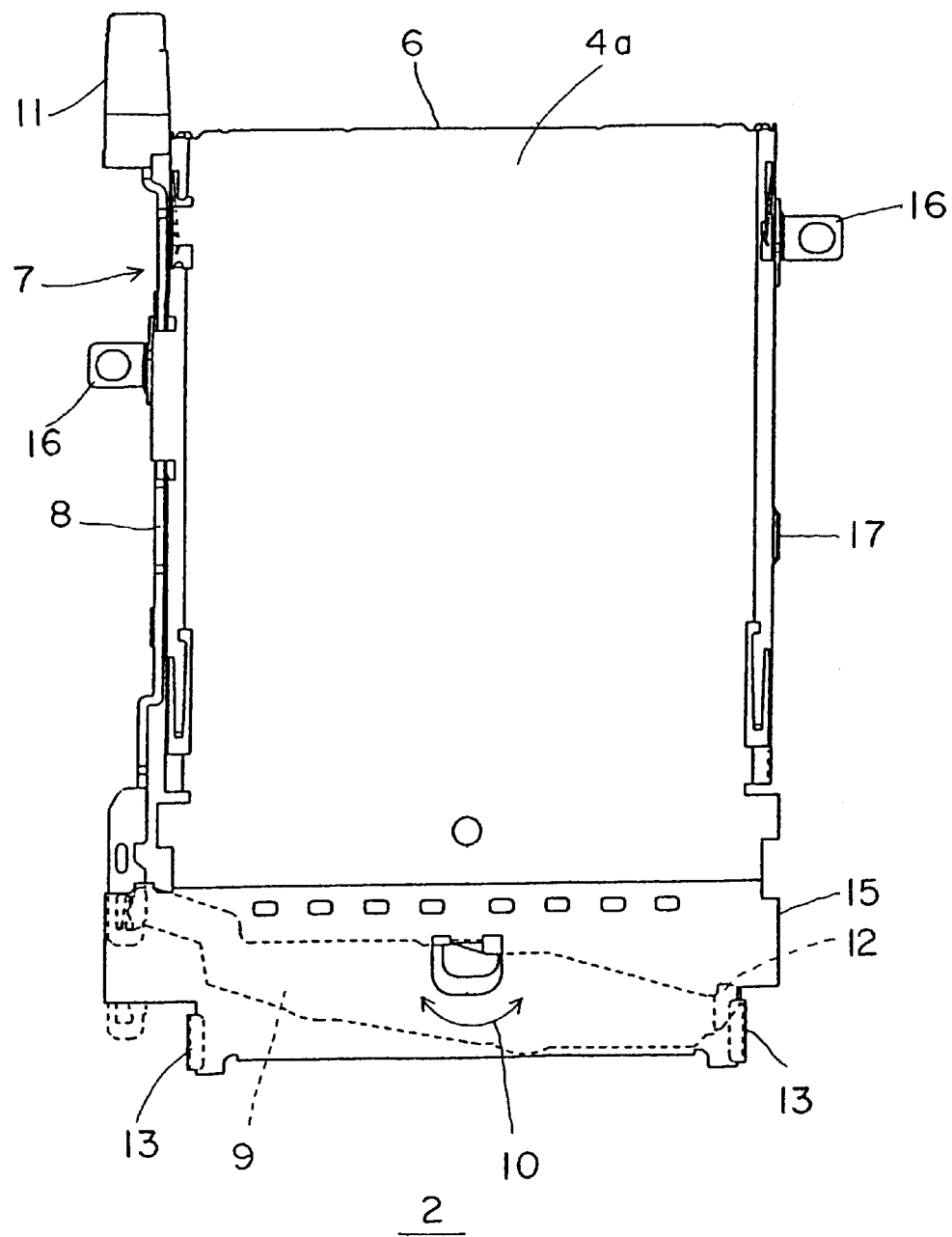
FIG. 2 is a plan view of the shell assembly of the card connector.
Figure 3:
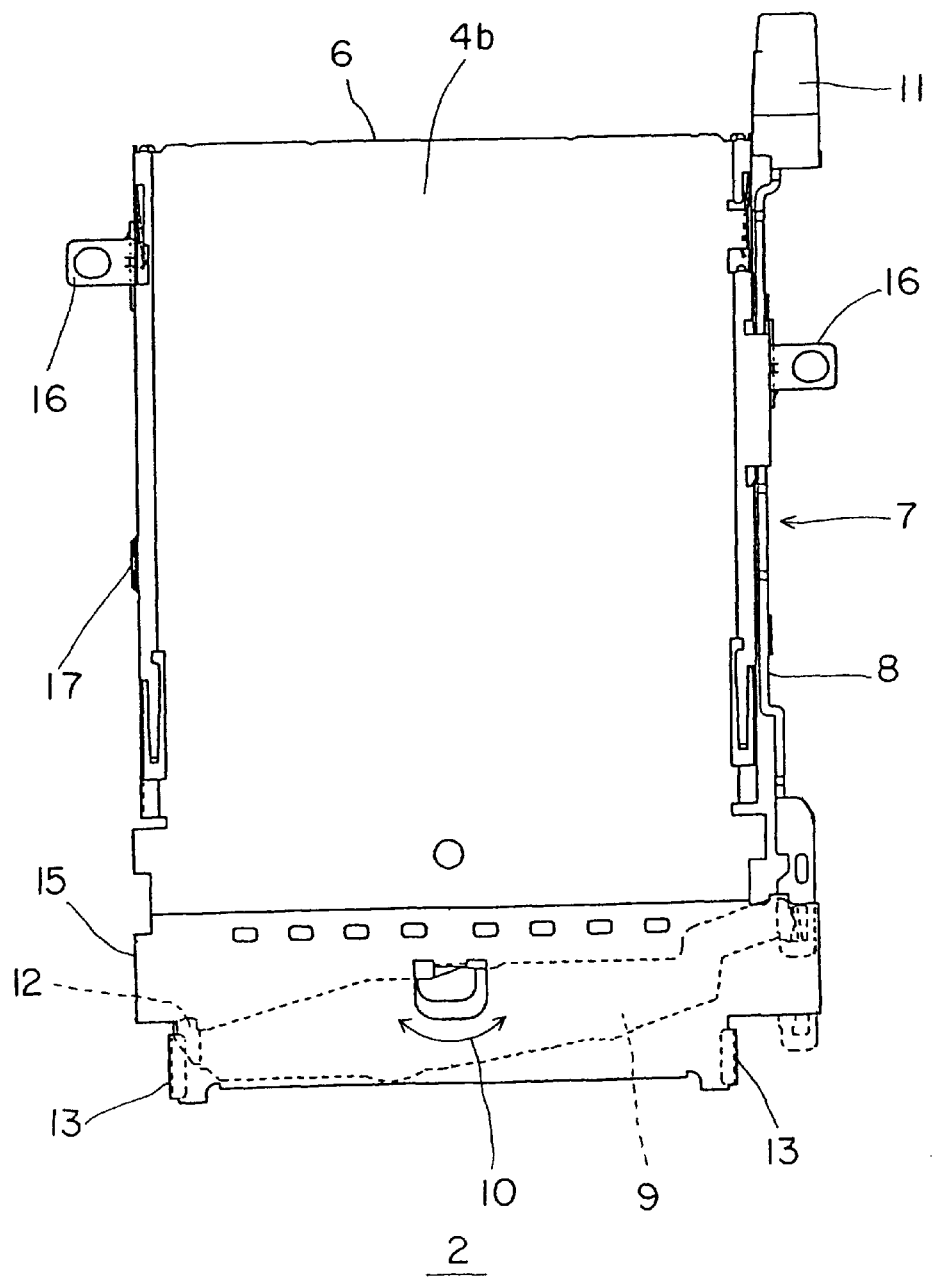
FIG. 3 is a bottom view of the shell assembly of the card connector.
Figure 4:
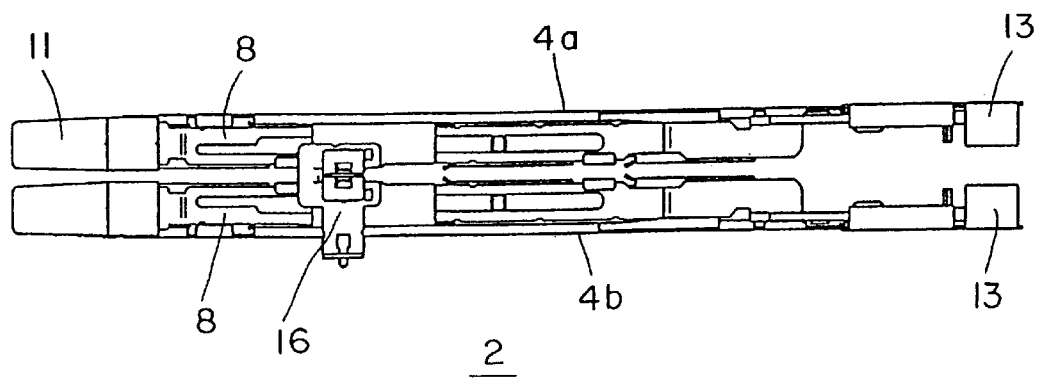
FIG. 4 is a left-side view of the shell assembly of the card connector.
Figure 5:
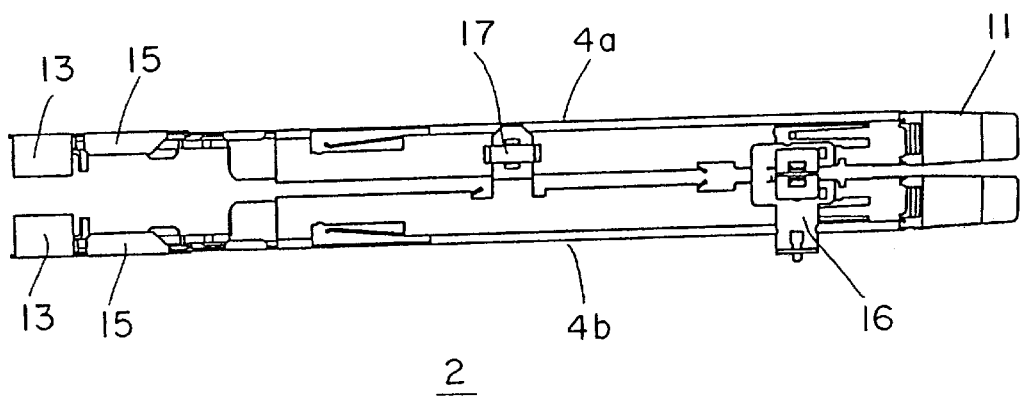
FIG. 5 is a right-side view of the shell assembly of the card connector.

Referring to the drawings, and first to FIG. 1, a card connector 1 according to the present invention comprises a shell assembly 2 for accommodating a memory device in the form of a memory or PC card, and a pin connector assembly 3 whose connection pins 20 (FIGS. 9 and 13) are received in receptacles of the memory device inserted in the shell assembly. Pin connector assembly 3 is adapted to be fixed to a printed circuit board (or PCB).

As seen in FIGS. 2 to 7, shell assembly 2 comprises upper and lower shell compartments 4a and 4b combined in a double-deck configuration. Each shell compartment is rectangularly-shaped to define a card-containing space 5 which accommodates and encloses at least a portion of a memory device inserted in the shell assembly. The shell compartments 4a and 4b are open on the front side (the top side in FIG. 2) to define a card-insertion inlet 6. Each shell compartment includes a card-ejection mechanism 7 composed of an ejection rod 8 and an ejection lever 9. Ejection rod 8 is slidably movable along one longitudinal side of the compartment and ejection lever 9 is pivotably attached at the rear side of the compartment. The rear distal end of ejection rod 8 is connected to one end of ejection lever 9. When the ejection rod is moved rearwardly by pushing an actuator button 11, the ejection lever pivots, as indicated by arrow 10, and contacts the card with an ejection end 12 of lever 9, thereby ejecting the card out of card-insertion inlet 6. The shell assembly is fabricated substantially entirely of stamped and formed conductive sheet metal material, however the actuator button may be fabricated of a dielectric molded plastic material.

Figure 6:
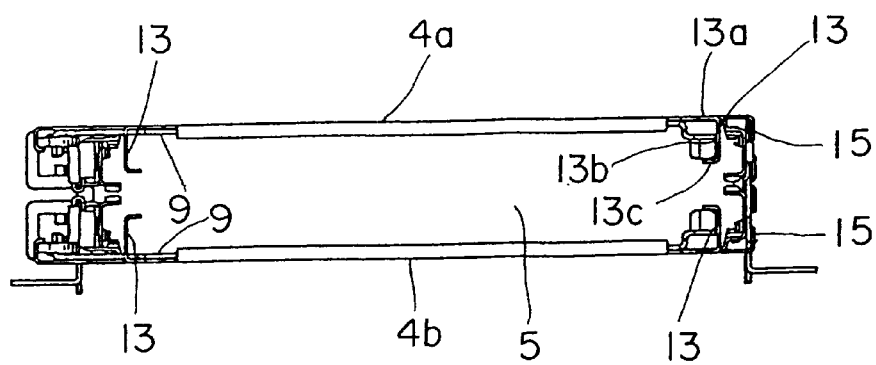
FIG. 6 is a front view of the shell assembly of the card connector.
Figure 7:
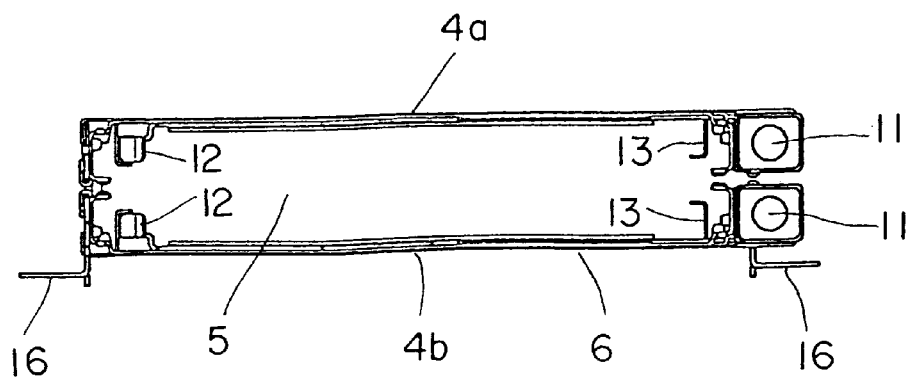
FIG. 7 is a rear view of the shell assembly of the card connector.

As shown most clearly in FIG. 6, upper shell compartment 4a has catch pieces 13 formed on opposite sides of the rear of the shell. Each catch piece 13 is composed of a first horizontal section 13a, a vertical section 13b and a second horizontal section 13c. Vertical section 13b is formed by bending a cut of an upper portion of the shell at a right angle to first horizontal section 13a, and the second horizontal section 13c is formed by bending back the cut at a right angle to vertical section 13b. As seen in FIG. 1, a lateral horizontal extension 14 extends laterally beyond one catch piece 13. The lateral horizontal extension 14 has a catch nail 15 extending downwardly from an end. Similarly, the rear side of lower shell compartment 4b has a shape symmetrical to the rear side of upper shell compartment 4a, having catch pieces 13 formed at opposite sides thereof. A lateral horizontal extension 14 extends laterally beyond one catch piece 13, having a catch nail 15 extending upwardly from its end, thus confronting catch nail 15 of upper shell compartment 4a. Upper and lower shell compartments 4a and 4b are attached on their longitudinal sides by leg pieces 16 and fasteners 17.

Referring now to FIGS. 8 through 15, pin connector assembly 3 comprises an insulating housing 18 and a plurality of signal terminals 19 fixed therein. Signal terminals 19 make up first and second groups. As shown most clearly in FIG. 13, each signal terminal of the first group of signal terminals has a connection pin 20 at one end and a solder tail 21 at the other end, wherein the solder tail extends below connection pin 20, generally parallel to and away from connection pin 20. Likewise, each signal terminal of the second group of signal terminals has a connection pin 20 at one end and a solder tail 21 at the other end, wherein the solder tail extends below connection pin 20, generally parallel to and toward connection pin 20. The first and second groups of terminals are arranged at upper and lower levels, respectively (see FIGS. 9 and 13), corresponding to the upper and lower compartments of the shell assembly, with both sets of connection pins 20 extending toward the front of insulating housing 18, and solder tails 21 of the first group of terminals extending toward the rear of insulating housing 18 and solder tails 21 of the second group of terminals extending toward the front of insulating housing 18.

Solder tails 21 of all signal terminals 19 are coplanar with respect to an underlying printed circuit board (not shown), thereby permitting the simultaneous soldering of all of the solder tails to corresponding conductors of the printed circuit board.

An alignment device 22a may be applied to insulating housing 18 to maintain the position of solder tails 21 of the second group of terminals during soldering (see FIGS. 12–15). The alignment device 22a is a comb-like plate, and is slidably attached to insulating housing 18 so that it slides along opposite side arms 23 which extend forwardly from housing body 18. After soldering solder tails 21 of signal terminals 19 to the printed circuit board, alignment device 22a may be moved away from the solder tails or removed. Similarly, an alignment device 22b may also be used to maintain the position of solder tails 21 of the first group of terminals.

Opposite side arms 23 are used as guide means during the assembly of shell assembly 2 to pin connector assembly 3. Specifically, each side arm 23 has upper and lower longitudinal guide slots 24 (FIGS. 8 and 9) to guide upper and lower engagement nails 15 of upper and lower shell compartments 4a and 4b into engagement with pin connector assembly 3. Upper and lower longitudinal guide slots 24 have engagement projections 25 (FIG. 12) formed therein to prevent the engagement nails from being pulled out of longitudinal guide slots 24 once inserted. When engagement nails 15 are inserted into guide slots 24, engagement nails 15 ride over engagement ramps 25, and are therefore prevented from moving back toward the front of the housing. The engagement nails are formed on one side of shell assembly 2 (FIG. 1), and are retained by ramp projections 25 in upper and lower guide slots 24 of one side arm 23 of pin connector assembly 3. Guide slots 24 of the other side arm 23 confronting the side of shell assembly 2 on which it has the ejection rod 8 are not used in guiding engagement nails 15.

Figure 9:
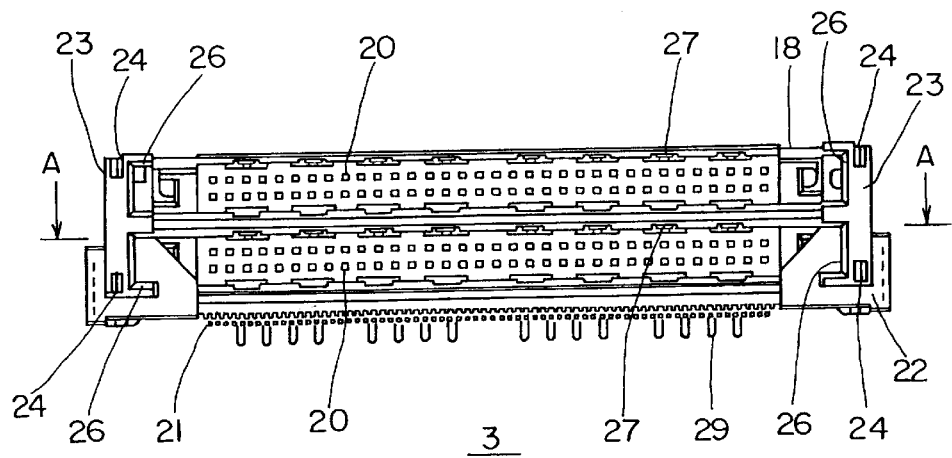
FIG. 9 is a rear view of the pin connector assembly of the card connector.
Figure 10:
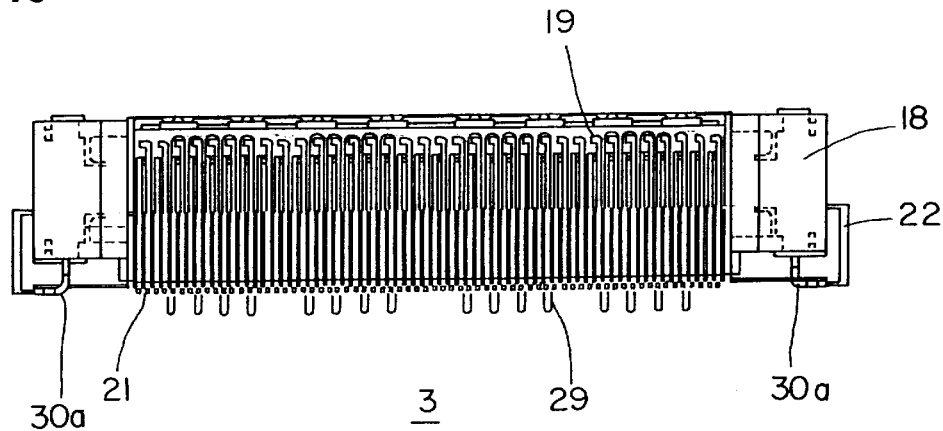
FIG. 10 is a front view of the pin connector of the card connector.
Figure 11:
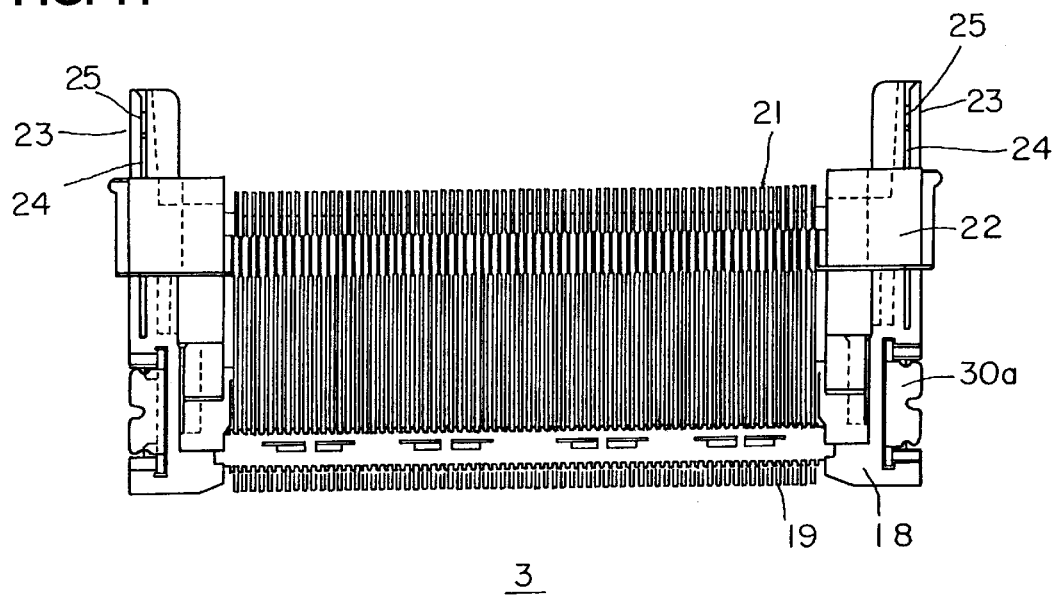
FIG. 11 is a bottom view of the pin connector assembly of the card connector.
Figure 12:
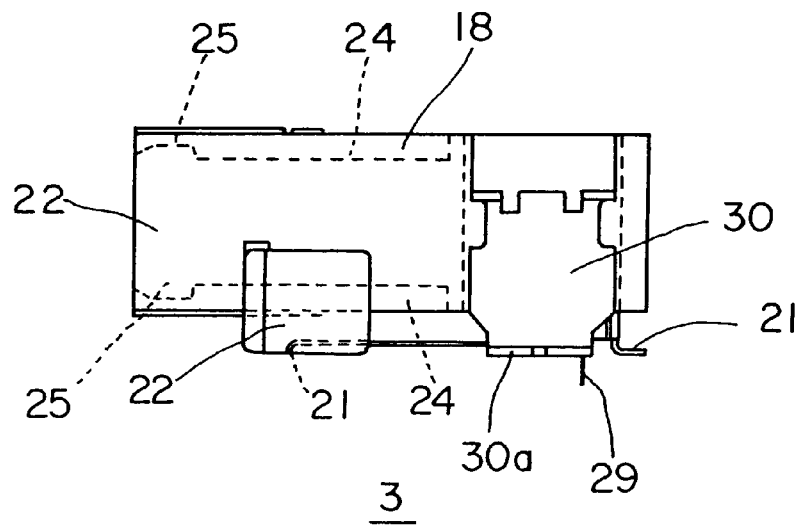
FIG. 12 is a left-side view of the pin connector assembly of the card connector.

Looking to FIG. 9, insulating housing 18 has receiving slots 26 extending rearwardly from the front of the housing for receiving catch pieces 13 of upper and lower shell compartments 4a and 4b of shell assembly 2. When engagement nails 15 reach the ends of upper and lower guide slots 24, catch pieces 13 are also received in receiving slots 26.

Figure 8:
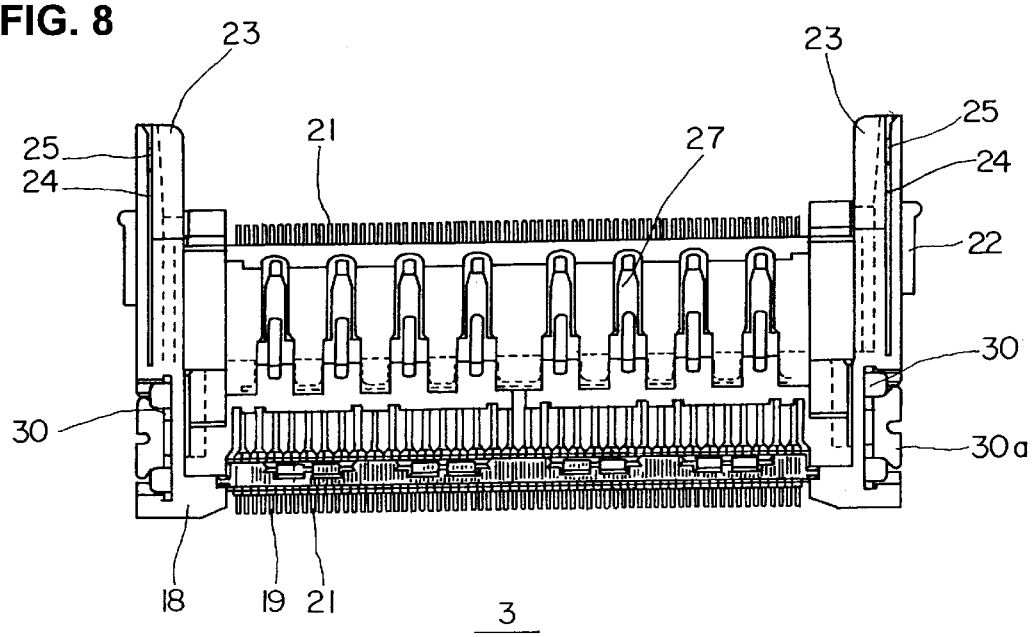
FIG. 8 is a plan view of the pin connector assembly of the card connector.
Figure 13:
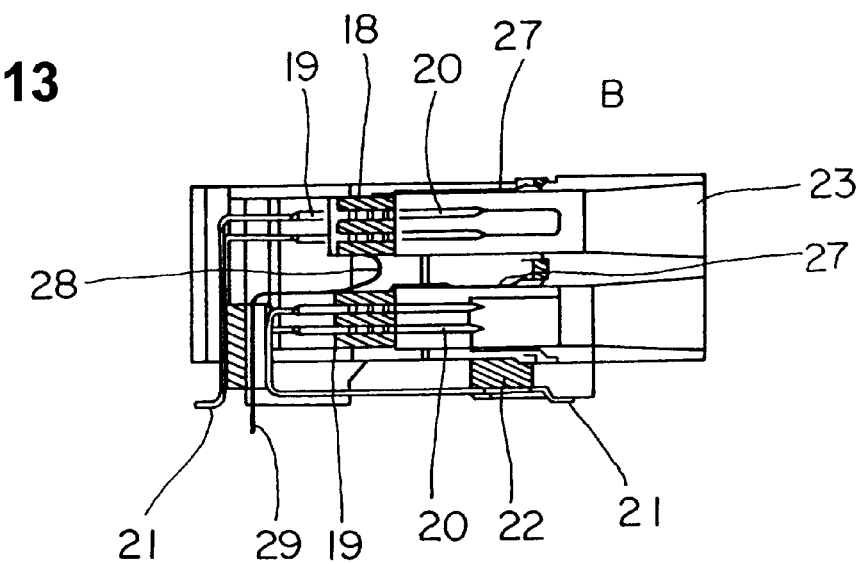
FIG. 13 is a sectional side view of the pin connector assembly of the card connector.
Figure 14:
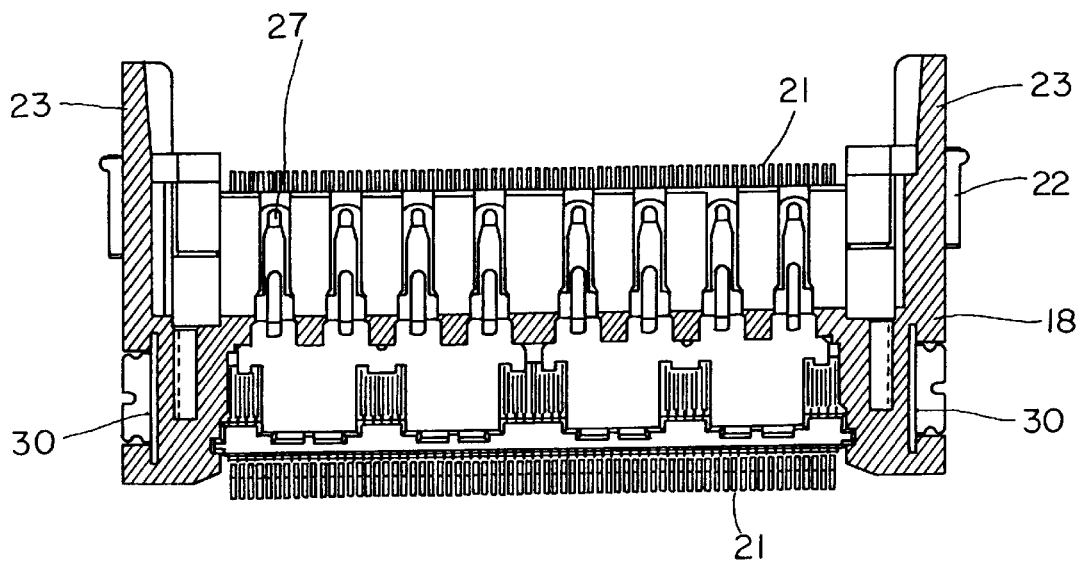
FIG. 14 is a sectional plan view of the pin connector assembly taken along line A—A in FIG. 9.
Figure 15:
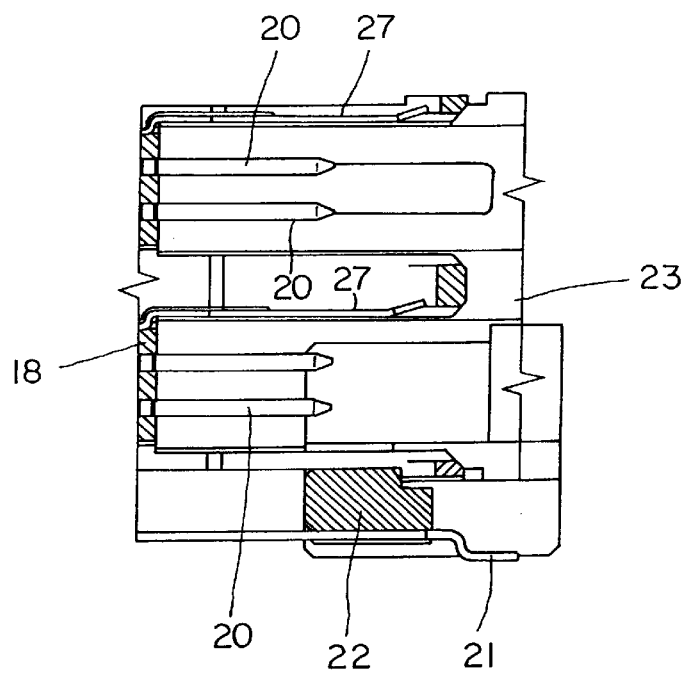
FIG. 15 is a sectional view of part B of FIG. 13.

Still looking at FIG. 9, in conjunction with FIG. 8, pin connector assembly 3 also includes grounding terminals 27 arranged parallel to selected connection pins 20. These grounding terminals 27 are adapted to contact and electrically ground the conductive shells of the memory cards to the ground circuit of the printed circuit board. As seen in FIG. 13, upper and lower grounding terminals 27 are connected by connecting pieces 28, and the downwardly extending solder tails 29 of lower grounding terminals 27 can be soldered to the printed circuit board simultaneously with solder tails 21 of signal terminals 19. Insulating housing 18 also includes L-shaped metal legs 30 attached to opposite sides thereof, and horizontal feet 30a of the L-shaped metal legs can also be soldered to the printed circuit board at the same time solder tails 21 are soldered.

FIGS. 16 through 20 show the progression of pin connector assembly 3 as it is assembled to shell assembly 2 to provide a finished card connector assembly.

First, pin connector assembly 3 is fixed on a predetermined area of the printed circuit board by simultaneously reflow-soldering solder tails 21 of signal terminals 19, solder tails 29 of grounding terminals 27 and feet 30a of L-shaped metal legs 30. Shell assembly 2 is then assembled to connector assembly 3 as set forth below.

Figure 16:
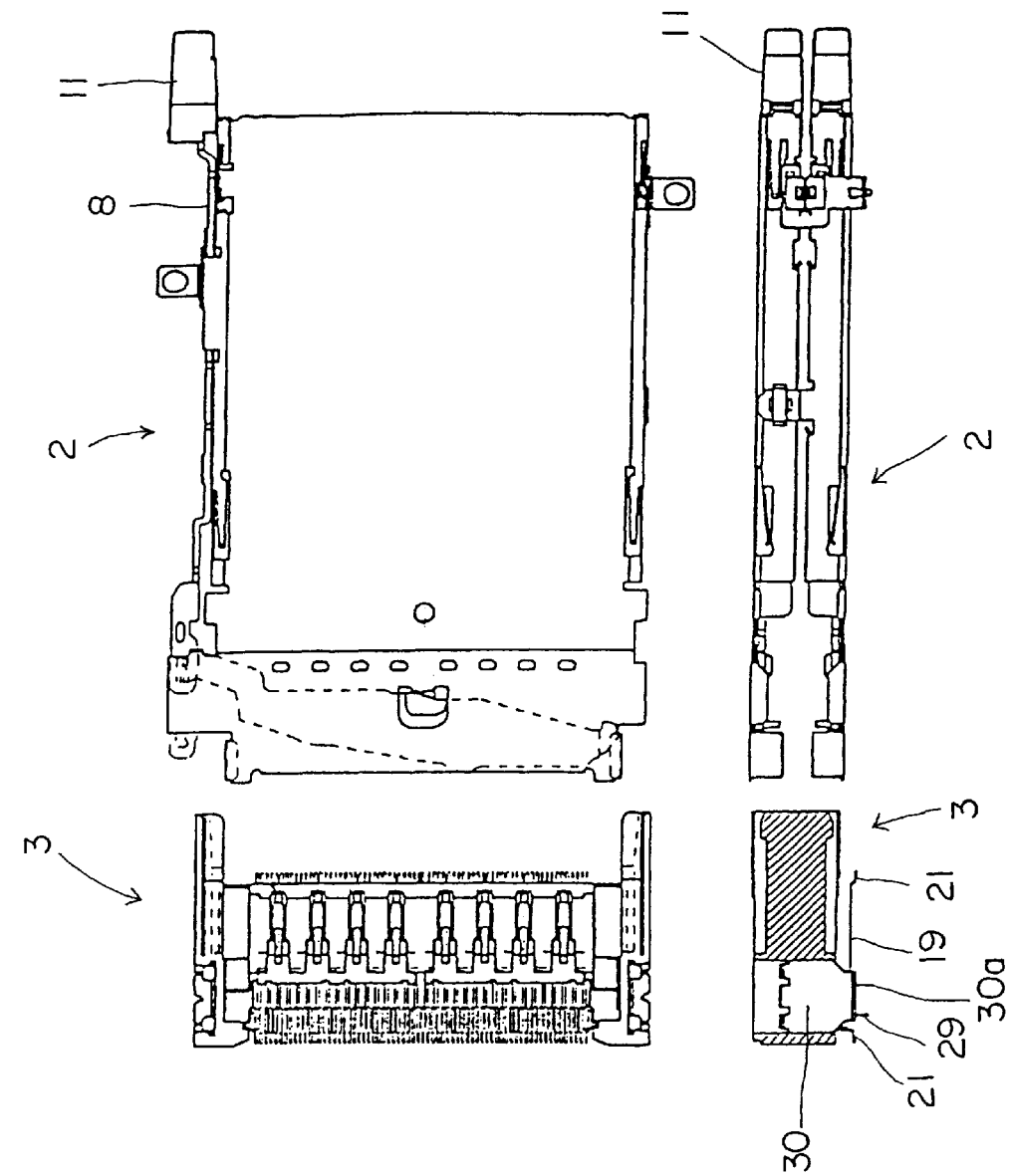
FIG. 16 shows the pin connector assembly and the shell assembly in confronting relation, in plan and in section.

As shown in FIG. 16, shell assembly 2 is positioned on the printed circuit board with its rear side facing pin connector assembly 3. Shell assembly 2 is positioned in front of pin connector assembly 3 with its ejection rod 8 on the right side as viewed in the direction in which a memory devices can be inserted in inlet 6 of shell assembly 2 (left as viewed in FIG. 16), however, shell assembly 3 could also be oriented such that ejection rod 8 is located on the left side.

Figure 17:
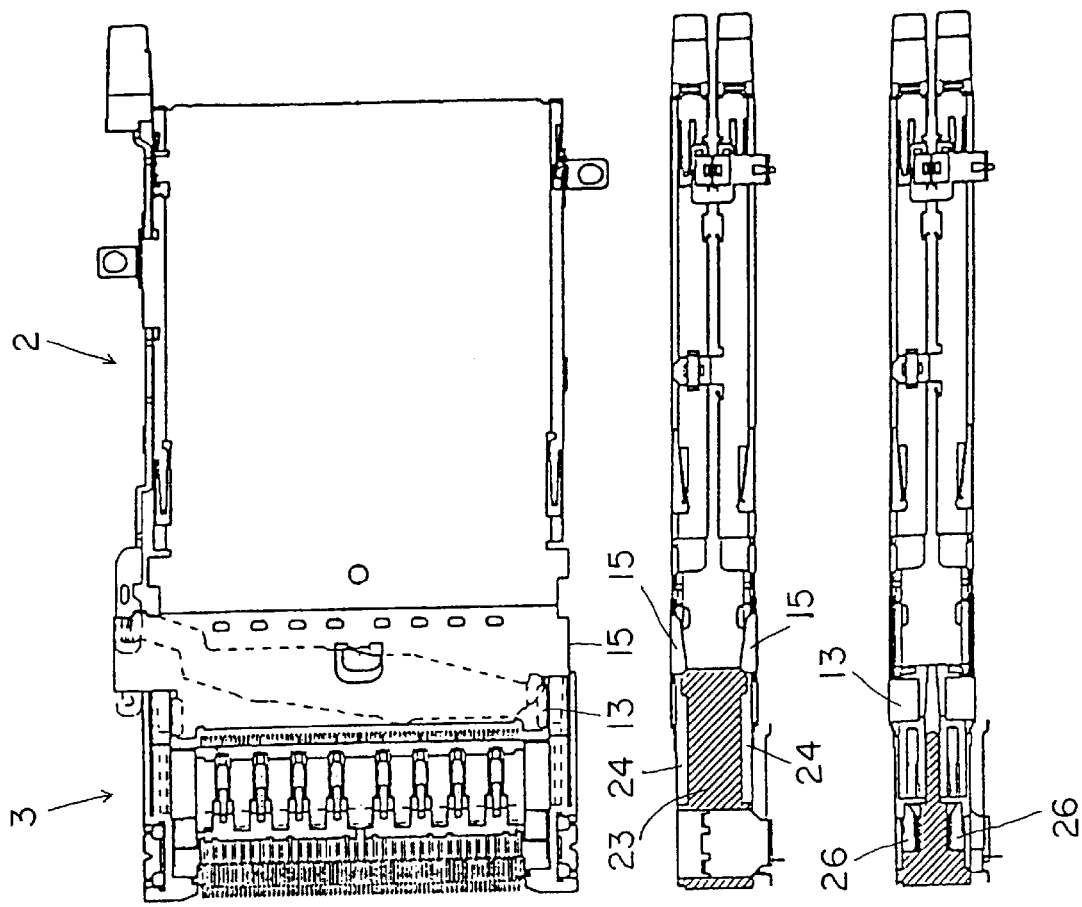
FIG. 17 shows plan and sectional views similar to that of FIG. 16 as the assemblies are getting closer.

As shown in FIG. 17, shell assembly 2 is moved closer to pin connector assembly 3 such that engagement nails 15 of shell assembly 2 enter into guide slots 24 of opposite arms 23 of pin connector assembly 3. Simultaneously catch pieces 13 of shell assembly 2 confront slots 26 of pin connector assembly 3.

Figure 18:
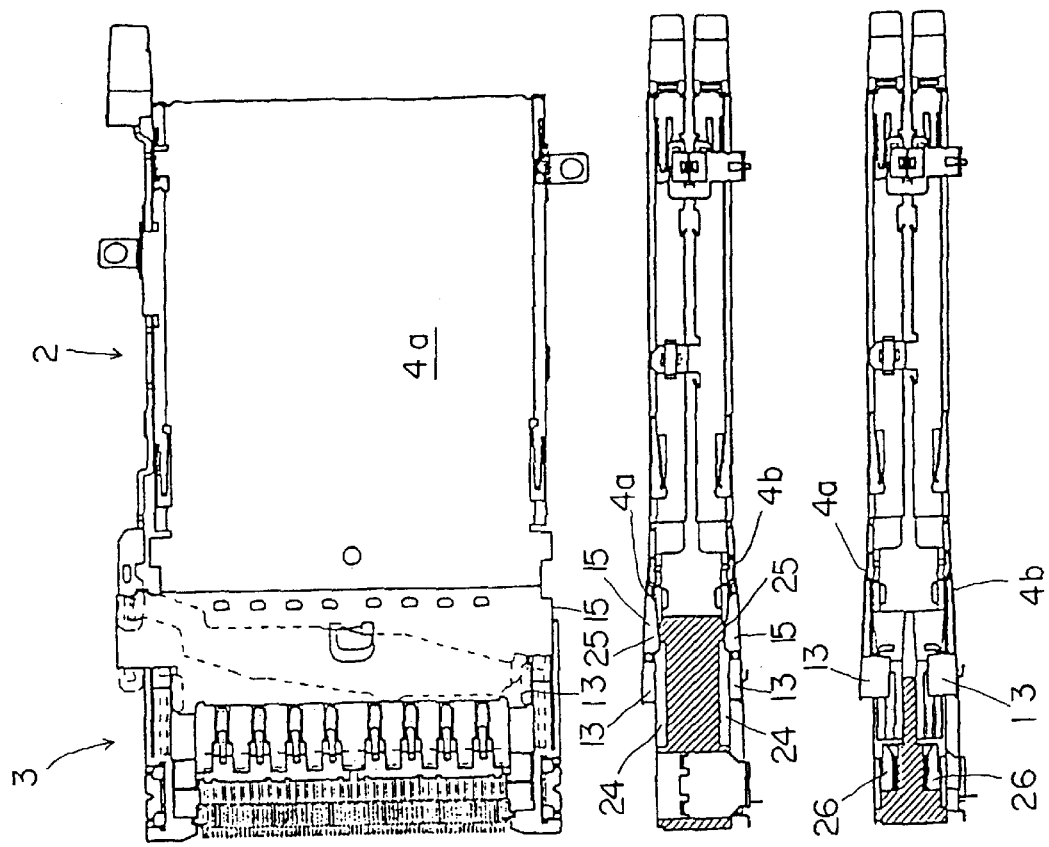
FIG. 18 shows plan and sectional views similar to that of FIG. 17 as the assemblies are getting still closer than in FIG. 17.

As shown in FIG. 18, shell assembly 2 is moved even closer to pin connector assembly 3. At this point, engagement nails 15 of shell assembly 2 encounter and ride over ramp projections 25 in guide slots 24 at which point upper shell compartment 4a is somewhat separated from lower shell compartment 4b.

Figure 19:
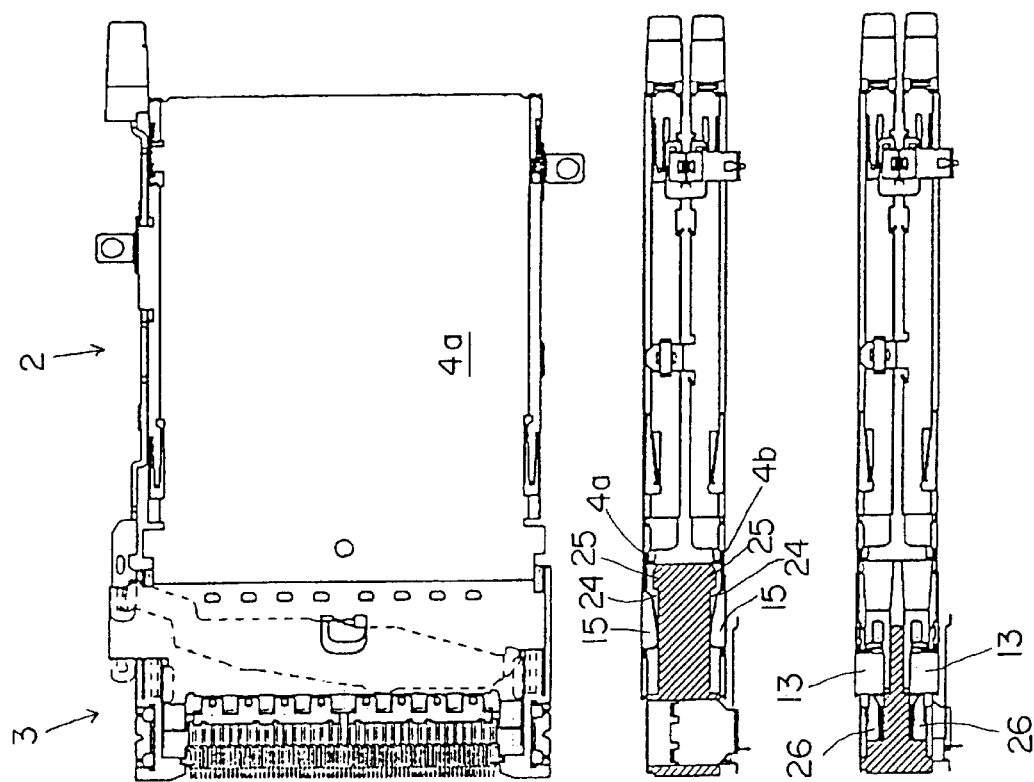
FIG. 19 shows plan and sectional views similar to that of FIG. 18 as the assemblies are getting still closer than in FIG. 18.

As shown in FIG. 19, shell assembly 2 is moved still closer to pin connector assembly 3. At this point, engagement nails 15 of shell assembly 2 pass over ramp projections 25 in guide slots 24, and the upper shell compartment 4a moves back to its unseparated position adjacent to lower shell compartment 4b. At the same time, catch pieces 13 of shell assembly 2, which were displaced from the confronting position relative to slots 26 of pin connector assembly 3, return to their original position whereat they confront slots 26 of pin connector assembly 3. After riding over ramp projections 25 in guide slots 24, engagement nails 15 of shell assembly 2 are prevented from being pulled out of guide slots 24 by ramp projections 25.

Figure 20:
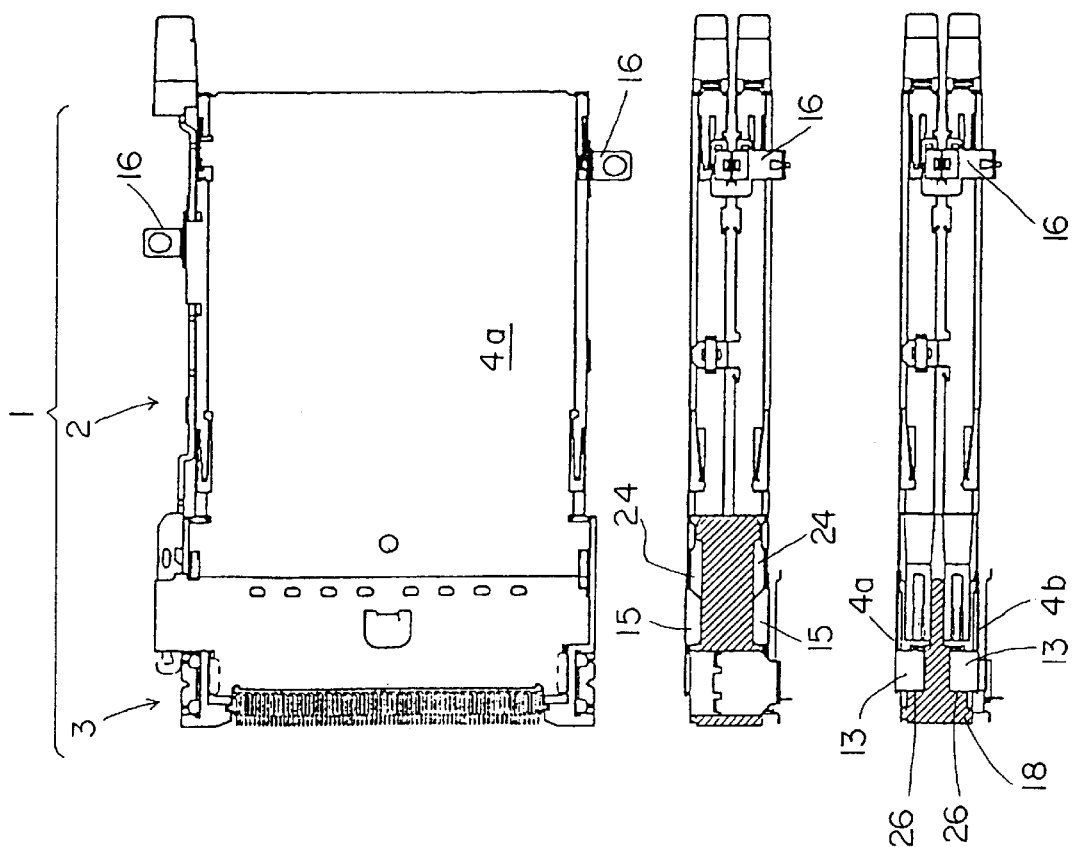
FIG. 20 shows the assemblies fully assembled, in plan and in section.

As seen in FIG. 20, shell assembly 2 comes in contact with pin connector assembly 3 as engagement nails 15 reach the ends of guide slots 24. Catch pieces 13 of shell assembly 2 are received in slots 26 of pin connector assembly 3 with upper and lower shell compartments 4a and 4b embracing insulating housing 18. Thus, shell assembly 2 and pin connector assembly 3 are assembled together to provide a card connector assembly. The card connector assembly is positively fixed to the printed circuit board by soldering pin connector assembly 3 to the printed circuit board and by fastening legs 16 of the shell assembly, which effectively prevent shell assembly 2 from unwanted and unnecessary movement.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A card connector assembly for connecting a memory device to a printed circuit board comprising:
    a shell assembly for accommodating the memory device including at least one shell compartment which encloses a substantial portion of the memory device; and
    a pin connector assembly including an insulating housing having
        a plurality of signal terminals mounted therein, each signal terminal including a connection pin adapted to be received in a corresponding receptacle of the memory device and a solder tail adapted to be soldered in a predetermined position to the printed circuit board, and a plurality of grounding terminals arranged generally parallel to the signal terminals, wherein said shell assembly is adapted to be assembled to said pin connector assembly by way of interengaging engagement members and corresponding slots on each side of the shell assembly and insulating housing of the connector assembly, respectively, whereby said shell assembly is assembled to said pin connector assembly after said solder tails of said signal terminals of said pin connector assembly are soldered to the printed circuit board.

2. A card connector assembly according to claim 1 wherein said shell assembly is a double-deck structure having an upper and lower shell compartment, and wherein the connection pins of said pin connector assembly are arranged in upper and lower rows to correspond to the upper and lower shell compartments of said shell assembly, thus permitting the upper and lower rows of the connection pins to be received in memory devices inserted into the upper and lower shell compartments.

3. A card connector assembly according to claim 2 wherein the insulating housing has upper and lower receiving slots in each side arm, and each of the upper and lower shell compartments includes an engagement piece integrally connected to each end which is received in a corresponding upper and lower receiving slots of the insulating housing upon assembly of the shell assembly to the pin connector assembly.

4. A card connector assembly according to claim 1 wherein said signal terminals of said pin connector assembly comprise first and second groups of terminals arranged in upper and lower levels, respectively, wherein each signal terminal of the first group includes a connection pin at one end and a solder tail at the other end, wherein the solder tail extends below the connection pin generally parallel to and away from the connection pin and toward the rear of the insulating housing, and each signal terminal of the second group includes a connection pin at one end and a solder tail at the other end, wherein the solder tail extends below the connection pin generally parallel to and toward the connection pin and toward the front of the housing.

5. A card connector assembly according to claim 4 wherein the insulating housing includes an alignment device to maintain the position of the solder tails of the second group of terminals during soldering.

6. A card connector assembly according to claim 4 wherein the insulating housing includes an alignment device to maintain the position of the solder tails of the first group of terminals during soldering.

7. A card connector assembly according claim 2 wherein the insulating housing has two side arms extending forward from opposite sides thereof, each including upper and lower longitudinal guide slots, and the upper and lower shell compartments of the shell assembly include upper and lower engagement nails which are received in said upper and lower longitudinal guide slots upon assembly of the shell assembly to the pin connector assembly.

8. A card connector assembly according to claim 7 wherein the guide slots include engagement projections formed therein to prevent the engagement nails from being removed from the longitudinal guide slots.

9. A method of assembling a card connector assembly for accommodating memory devices comprising a shell assembly having two shell compartments which enclose a substantial portion of each of said memory devices and having upper and lower engagement members integrally formed on each side of the compartments, and a pin connector assembly having connection pins adapted to be received in each memory device, a plurality of grounding terminals arranged generally parallel to the connection pins, and an insulating housing having upper and lower receiving slots formed therein corresponding to each of the engagement members, wherein the method comprises the steps of:

fixing the pin connector assembly directly to a printed circuit board by soldering; and assembling said shell assembly to said pin connector assembly thus fixed on the printed circuit board by moving the shell assembly into engagement with the pin connector assembly.

10. A method of assembling a card connector assembly according to claim 9 wherein the shell assembly further comprises fixing legs integrally connected to the shell compartments, the method further comprising the step of:

fixing said shell assembly to the printed circuit board by soldering the legs to corresponding areas on the printed circuit board.

11. A card connector assembly for connecting two memory devices to a printed circuit board comprising:

a double-deck shell assembly for accommodating the memory devices including an upper and lower shell compartment each of which includes a card-ejection mechanism composed of an ejection rod and an ejection lever; and a pin connector assembly including an insulating housing having a plurality of signal terminals mounted therein, each signal terminal including a connection pin arranged in upper and lower rows to correspond to the upper and lower shell compartments of said shell assembly and adapted to be received in a corresponding receptacle of a respective memory device and a solder tail adapted to be soldered to the printed circuit board, and a plurality of grounding terminals arranged generally parallel to the signal terminals, wherein said shell assembly is adapted to be assembled to said pin connector assembly by way of interengaging engagement members and corresponding slots on each side of the upper and lower shell compartments of the shell assembly and the insulating housing of the connector assembly, respectively.

* * * * *